(12) United States Patent
Lerner

(10) Patent No.: US 10,930,497 B2
(45) Date of Patent: Feb. 23, 2021

(54) SEMICONDUCTOR SUBSTRATE AND METHOD FOR PRODUCING A SEMICONDUCTOR SUBSTRATE

(71) Applicant: X-FAB SEMICONDUCTOR FOUNDRIES GMBH, Erfurt (DE)

(72) Inventor: Ralf Lerner, Erfurt (DE)

(73) Assignee: X-FAB SEMICONDUCTOR FOUNDRIES GMBH, Erfurt (DE)

( * ) Notice: Subject to any disclaimer, the term of this patent is extended or adjusted under 35 U.S.C. 154(b) by 0 days.

(21) Appl. No.: 15/877,496

(22) Filed: Jan. 23, 2018

(65) Prior Publication Data

US 2018/0211835 A1 Jul. 26, 2018

(30) Foreign Application Priority Data

Jan. 24, 2017 (DE) .................... 10 2017 101 333.4

(51) Int. Cl.
*H01L 21/00* (2006.01)
*H01L 21/02* (2006.01)
*H01L 21/762* (2006.01)
*H01L 29/06* (2006.01)
*H01L 29/267* (2006.01)

(52) U.S. Cl.
CPC .. *H01L 21/02488* (2013.01); *H01L 21/02505* (2013.01); *H01L 21/76251* (2013.01); *H01L 29/0649* (2013.01); *H01L 29/267* (2013.01)

(58) Field of Classification Search
CPC ............. H01L 21/02488; H01L 29/267; H01L 29/0649
See application file for complete search history.

(56) References Cited

U.S. PATENT DOCUMENTS

| 3,421,055 A | 1/1969 | Bean et al. |
| 3,993,533 A | 11/1976 | Milnes et al. |
| 4,381,202 A | 4/1983 | Mori et al. |
| 5,304,834 A | 4/1994 | Lynch |

(Continued)

FOREIGN PATENT DOCUMENTS

| CN | 1959933 | 5/2007 |
| CN | 101106161 | 1/2008 |

(Continued)

OTHER PUBLICATIONS

Office Action dated Sep. 4, 2017 in related German Application No. 102017101333.4, 10 pages.

(Continued)

*Primary Examiner* — Laura M Menz
(74) *Attorney, Agent, or Firm* — Nixon & Vanderhye PC

(57) ABSTRACT

A method for producing a semiconductor substrate and a semiconductor substrate for use in epitaxial methods of a semiconductor material are described. The semiconductor substrate includes a support slice, an intermediate layer situated on the support slice, and an active layer situated on the intermediate layer. The intermediate layer includes a material which has a reduced viscosity or flows when the semiconductor substrate is used in an epitaxial method in order to enable at least a partial adaptation of a crystal lattice of the active layer to a crystal lattice of the semiconductor material at the transition between the active layer and the semiconductor material.

23 Claims, 7 Drawing Sheets

(56) References Cited

U.S. PATENT DOCUMENTS

Figure 1:
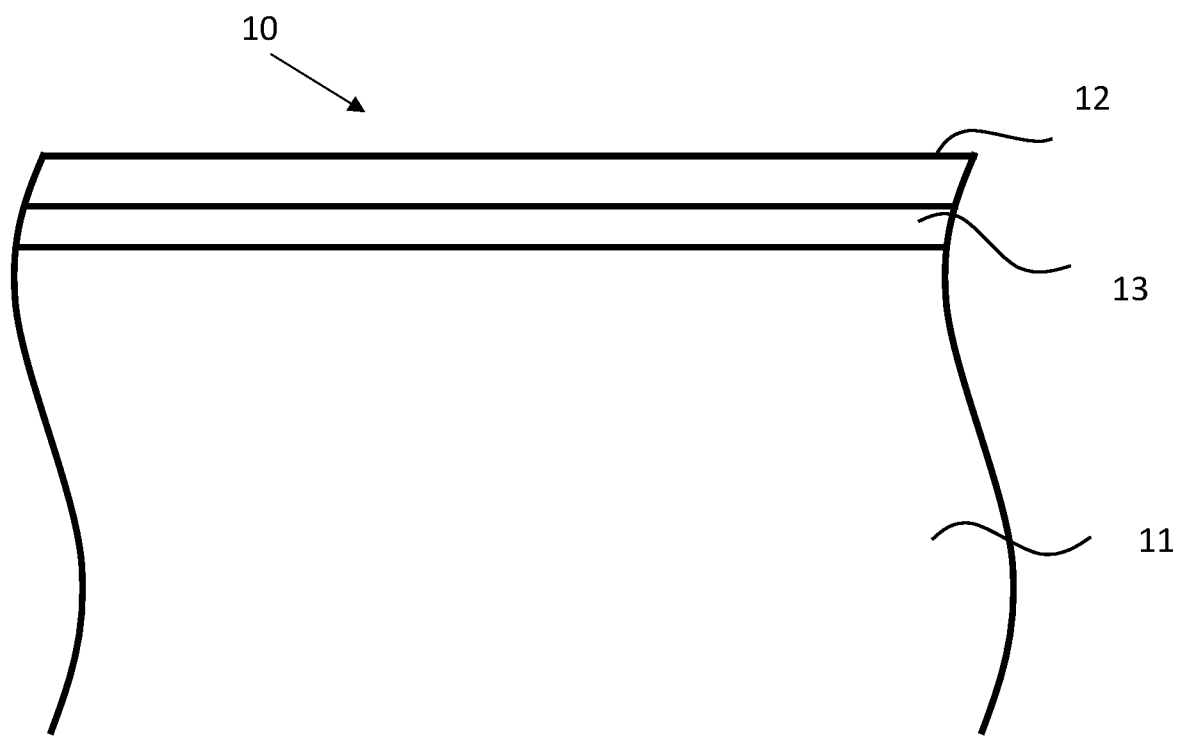

| | | | |
|---|---|---|---|
| 5,670,411 A | 9/1997 | Yonehara et al. | |
| 7,049,201 B2 | 5/2006 | Verma et al. | |
| 7,682,944 B2 * | 3/2010 | Brandes | H01L 21/0254 438/478 |
| 7,777,250 B2 * | 8/2010 | Lochtefeld | H01L 21/02538 257/190 |
| 8,119,494 B1 * | 2/2012 | Vellianitis | H01L 21/02538 438/413 |
| 8,324,660 B2 * | 12/2012 | Lochtefeld | H01L 33/30 257/190 |
| 8,722,526 B2 | 5/2014 | Lee | |
| 9,064,699 B2 * | 6/2015 | Wang | H01L 21/02546 |
| 9,093,271 B2 | 7/2015 | Schenk et al. | |
| 9,530,669 B1 * | 12/2016 | Balakrishnan | H01L 21/02381 |
| 10,453,947 B1 * | 10/2019 | Lin | H01L 21/0243 |
| 10,797,681 B1 * | 10/2020 | Hurwitz | H01L 23/66 |
| 2003/0038299 A1 | 2/2003 | Demkov | |
| 2009/0039361 A1 * | 2/2009 | Li | H01L 29/205 257/94 |
| 2013/0037857 A1 * | 2/2013 | Von Kanel | H01L 21/0265 257/190 |
| 2014/0051235 A1 | 2/2014 | Izumi et al. | |
| 2016/0064630 A1 * | 3/2016 | Castro | H01L 33/647 257/99 |
| 2016/0315142 A1 * | 10/2016 | Li | H01L 21/26506 |
| 2018/0211835 A1 * | 7/2018 | Lerner | H01L 21/02505 |
| 2018/0254194 A1 * | 9/2018 | Li | H01L 23/3192 |
| 2020/0161306 A1 * | 5/2020 | Seo | H01L 27/10876 |

FOREIGN PATENT DOCUMENTS

| | | | |
|---|---|---|---|
| DE | 2636383 | 2/1977 | |
| DE | 19905517 | 12/1999 | |
| DE | 102017101333 A1 * | 7/2018 | H01L 21/02505 |
| EP | 0884767 | 12/1998 | |
| GB | 1504484 | 3/1978 | |
| GB | 2338107 | 12/1999 | |
| JP | 2018137431 A * | 8/2018 | H01L 21/76251 |
| WO | 2004/073045 | 8/2004 | |
| WO | 2005/043604 | 5/2005 | |
| WO | 2005/118291 | 12/2005 | |
| WO | WO-2015047355 A1 * | 4/2015 | H01L 21/02433 |

OTHER PUBLICATIONS

Office Action dated Mar. 9, 2020 in related German Application No. 102017101333.4, 8 pages.

* cited by examiner

SEMICONDUCTOR SUBSTRATE AND METHOD FOR PRODUCING A SEMICONDUCTOR SUBSTRATE

This application claims priority to DE Patent Application No. 102017101333.4, filed Jan. 24, 2017, the entire content of which is hereby incorporated by reference.

The invention relates to a method for producing a semiconductor substrate and a semiconductor substrate for use in epitaxial methods of a semiconductor material.

In hetero-epitaxial methods of semiconductor layers on a semiconductor substrate, mechanical distortions can occur and thereby the formation of crystal defects, such as, for example, dislocations owing to different crystalline properties, such as, for example, different lattice constants and/or lattice structures, between a semiconductor layer and a semiconductor substrate. Such mechanical distortions and crystal defects arise, for example, in the epitaxy of gallium nitride (GaN) on a silicon substrate with a (111) crystal orientation. In this case gallium nitride has a wurtzite structure lattice constant of a=0.3189 nm and c=0.5185 nm and silicon a lattice constant of a=0.543 nm.

In order to be able to reduce the formation of these mechanical distortions, buffer layers, for example, are used which are deposited, for example, directly on the semiconductor substrate. In order to reduce the density of the crystal defects, these buffer layers are typically grown with a thickness greater than 1 μm. Exemplary buffer layers can be formed by aluminum nitride (AlN), gallium arsenide (GaAS), or gallium nitride (GaN).

In order to (further) reduce the formation of mechanical distortions, an intermediate layer can also be deposited. This intermediate layer can be used in addition to a buffer layer or instead of a buffer layer. Exemplary intermediate layers can include silicon nitride (SiN), zirconium diboride (ZrB2), boron-aluminum-gallium-indium nitride (BAlGaInN) or aluminum arsenide (AlAs).

FIG. 1 shows a semiconductor substrate 10 known from the prior art. The semiconductor substrate 10 in FIG. 1 consists of a support slice 11, an active layer or active substrate layer 12 and a buried oxide layer 13. This oxide layer 13 is arranged in FIG. 1 between the support wafer 11 and the active layer 12. The semiconductor substrate 10 shown in FIG. 1 corresponds to a so-called silicon-on-insulator substrate (or SOD, in which the oxide layer 13 includes silicon dioxide and the support slice 11 and the active layer are formed from silicon.

The inventors have found that different crystalline properties between the active layer and the semiconductor material can result in mechanical distortions in the semiconductor material which can lead to crystal defects, such as e.g. dislocations, in the semiconductor material. Typical densities of these crystal defects lie approximately in the region of $10^5$ cm$^{-2}$. Such crystal defect densities can considerably influence the performance of components which are formed at least partly by the semiconductor material.

The inventors have additionally found that the use of buffer layers can lead to an increase of the duration of the epitaxial method of the semiconductor material, since these buffer layers typically require a thickness of greater than 1 μm, in order to achieve a reduction of the crystal defect density. The use of buffer layers additionally leads to an increased material usage, which can contribute to increased costs of the epitaxial method and thus to increased costs of the components.

Starting from the prior art, the object on which the invention is based is to make an alternative semiconductor substrate for use in epitaxial methods producible.

This and other problems can be solved, for example, by the features set out in the independent patent claims.

Advantages of the exemplary embodiments or specific exemplary embodiments of this invention include a reduction of the mechanical distortions, e.g. by an at least partial adaptation of the crystal lattice of the active layer or of the active substrate layer to a crystal lattice of the semiconductor material at the transition between the active layer and the semiconductor material when the semiconductor substrate is used in an epitaxial method. Thus, for example, stable and reliable semiconductor components can be produced, the performance of which is increased by the reduction of the mechanical distortions in the semiconductor material. Owing to the reduction of the mechanical distortions, it is furthermore also possible to dispense with thick buffer layers. As a result, the duration of the epitaxial method and the material usage can be reduced. A reduced duration of the epitaxial method and a reduced material usage can lead to reduced costs of the epitaxial method and thus to reduced costs of the components.

In specific exemplary embodiments, an intermediate layer can be deposited on a support slice. An active layer can subsequently be deposited on the intermediate layer, wherein the intermediate layer includes a material which has a reduced viscosity when the semiconductor substrate is used in an epitaxial method in order to enable an adaptation or at least a partial adaptation of the crystal lattice of the active layer to a crystal lattice of the semiconductor material at the transition between the active layer and the semiconductor material. In this case, therefore the viscosity of the material is reduced such that an adaptation or an at least partial adaptation of the crystal lattice of the active layer to the crystal lattice of the semiconductor material at the transition between the active layer and the semiconductor material can be enabled.

In specific exemplary embodiments, a semiconductor material can be deposited on the active layer by epitaxy, wherein the material of the intermediate layer has the effect that the intermediate layer at the epitaxial temperature of the semiconductor material forms a flowing intermediate layer. Thus, the flowing intermediate layer can enable an adaptation or an at least partial adaptation of the crystal lattice of the active layer to a crystal lattice of the semiconductor material at the transition between the active layer and the semiconductor material.

Further advantageous configurations of the subject-matters of the independent claims are specified in the subclaims.

Figure 2:
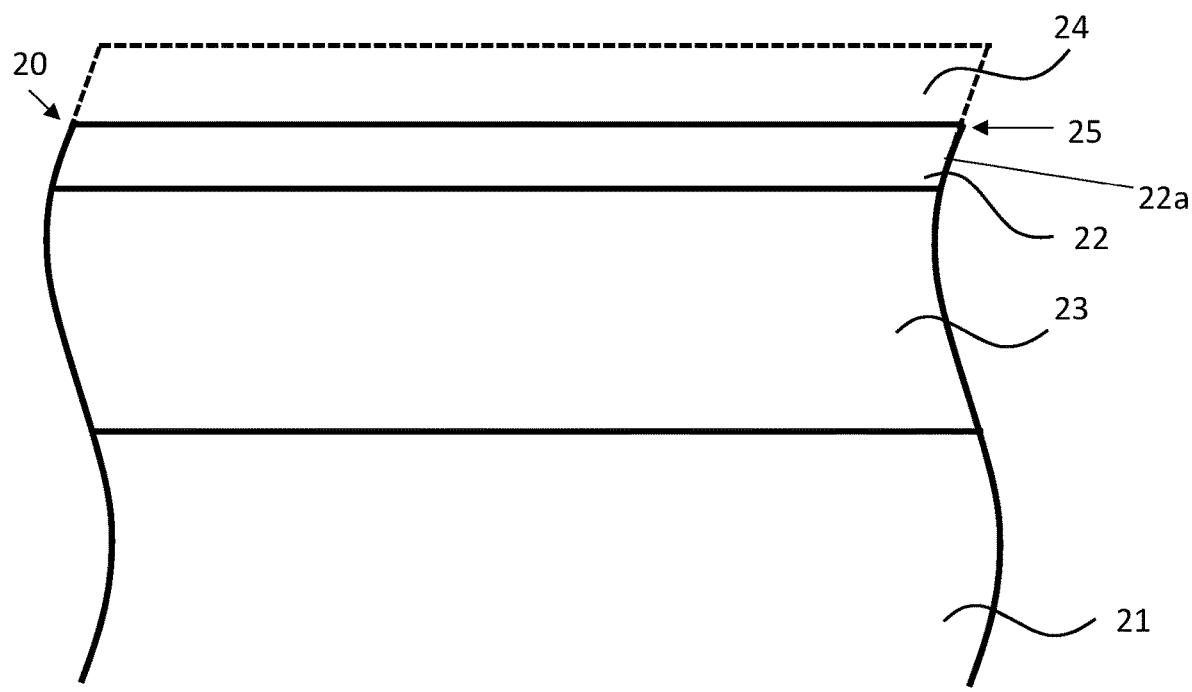
Figure 3:
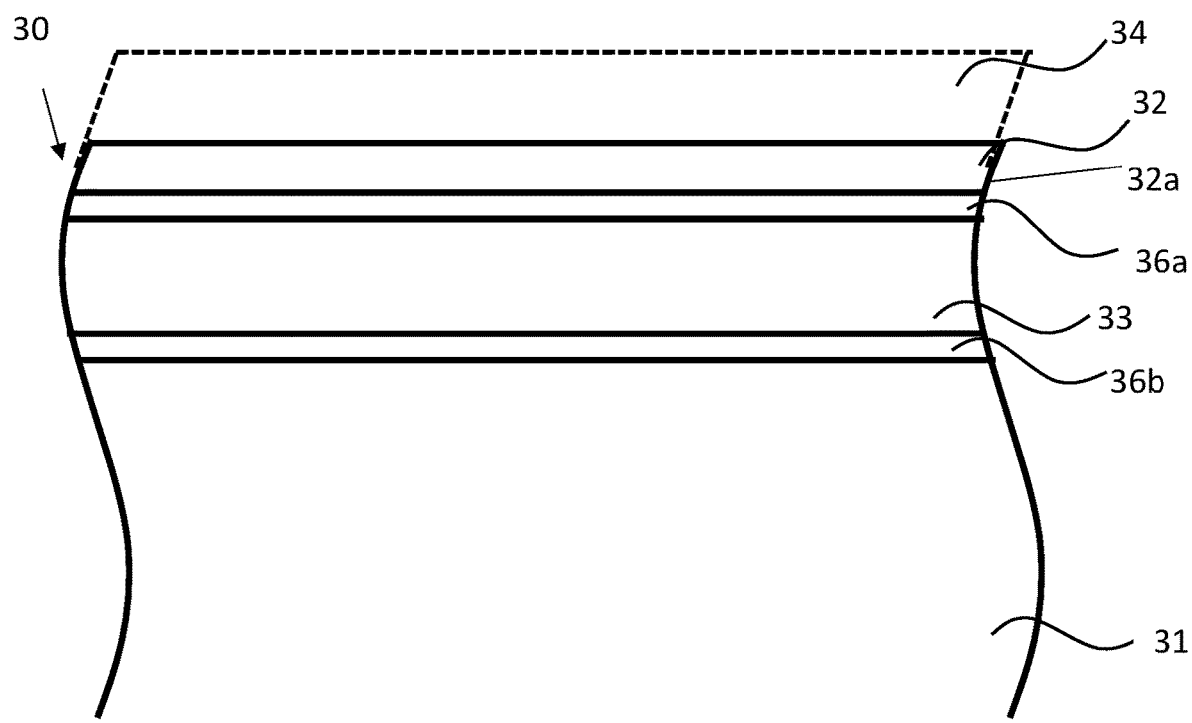
Figure 4:
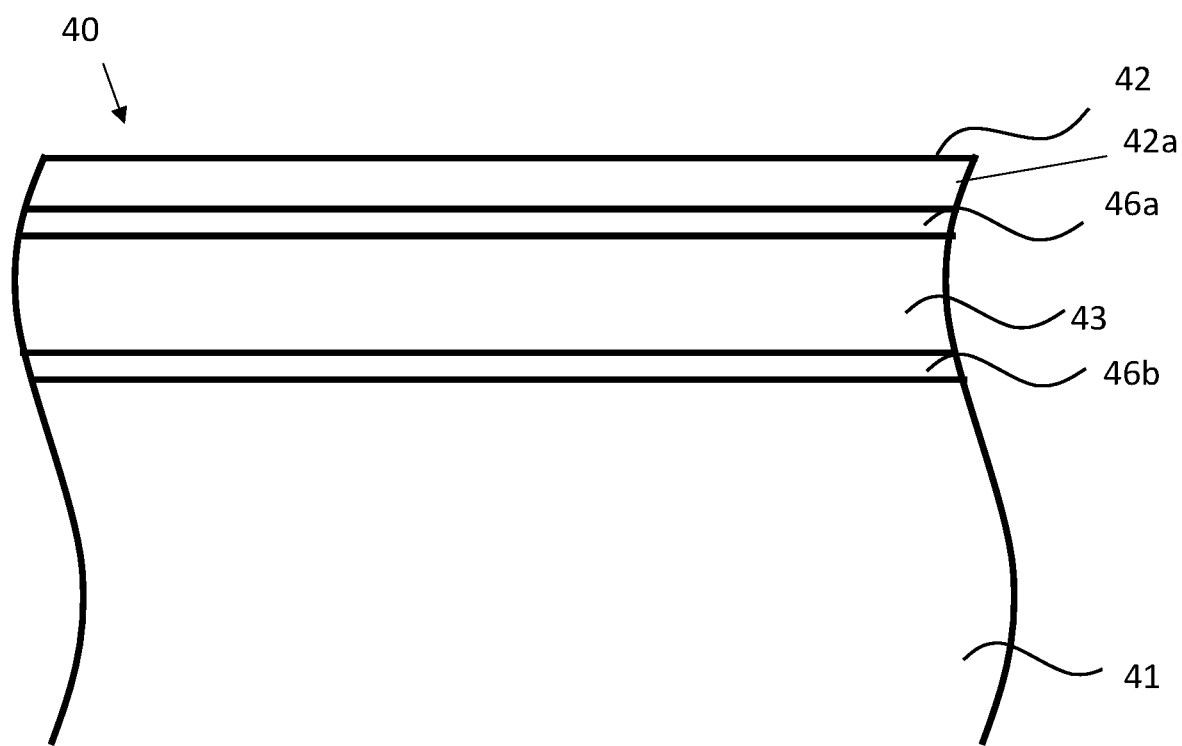
Figure 5:
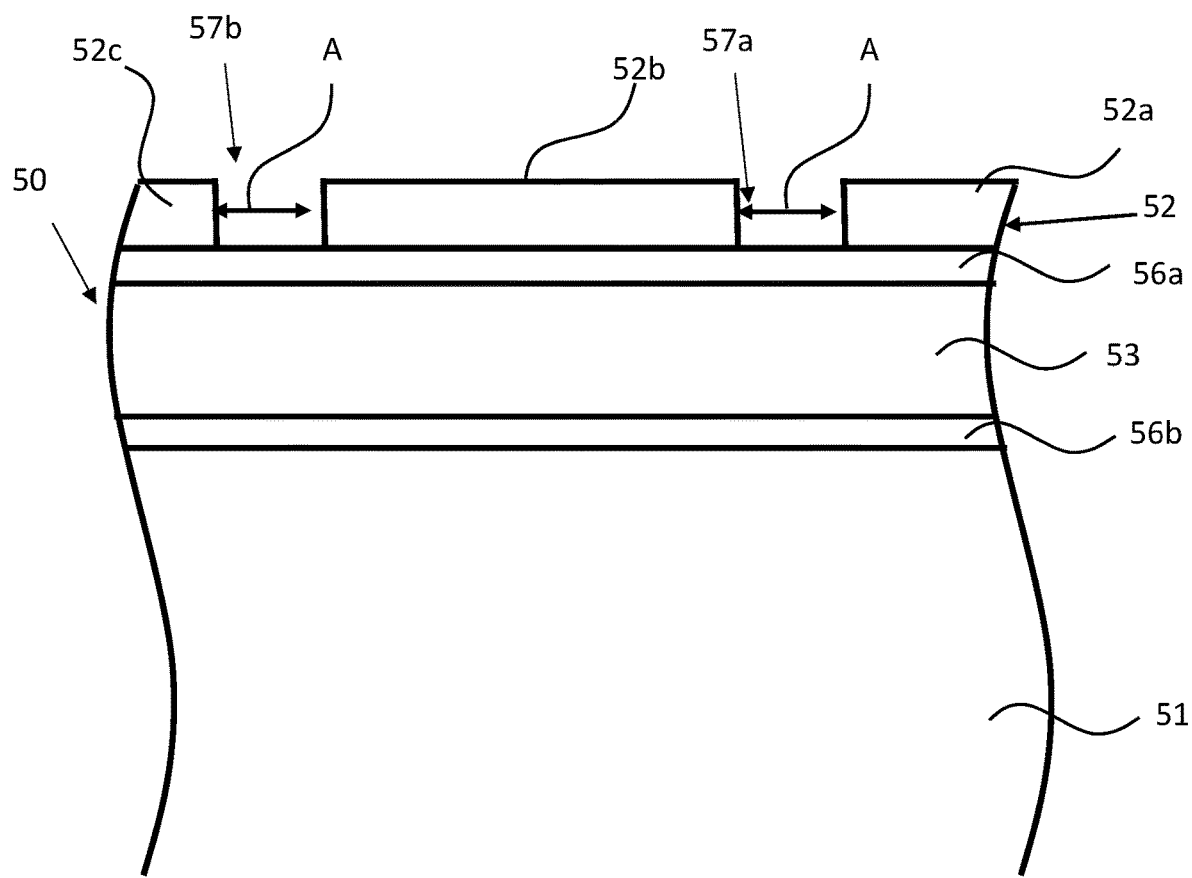
Figure 6:
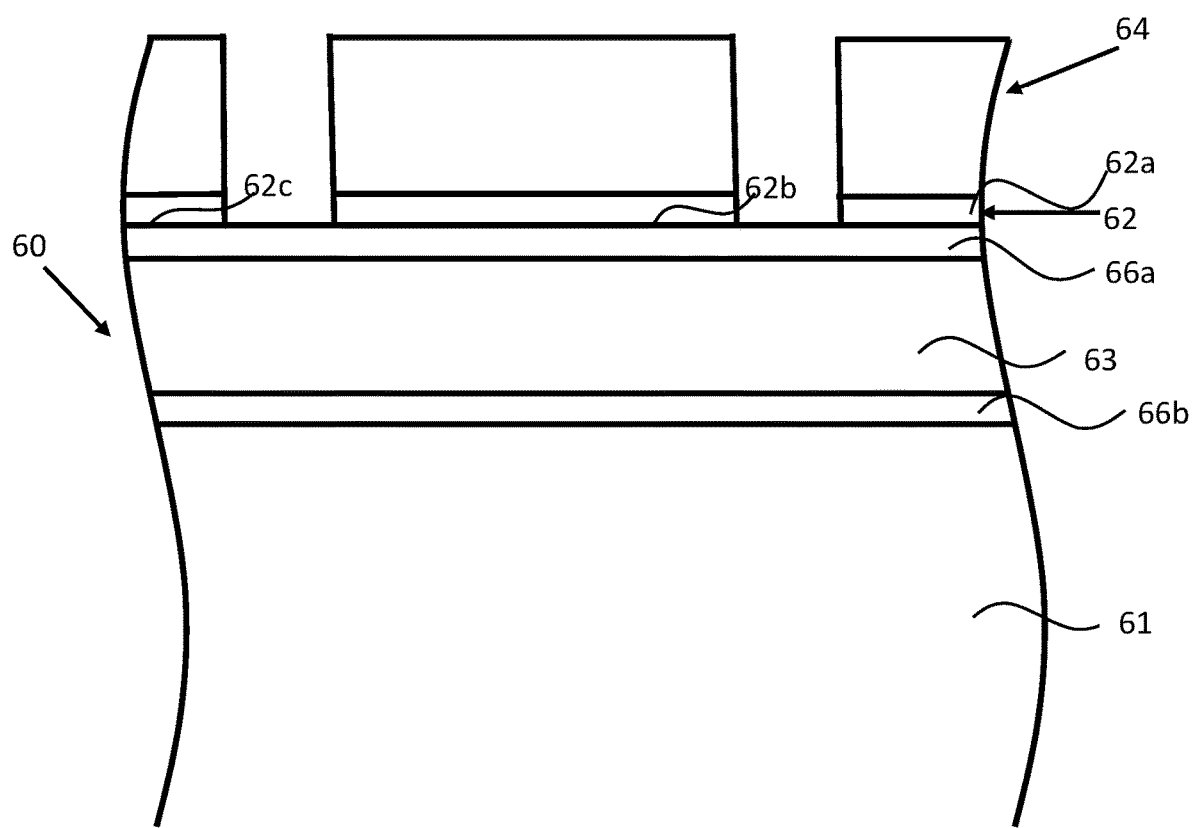
Figure 7:
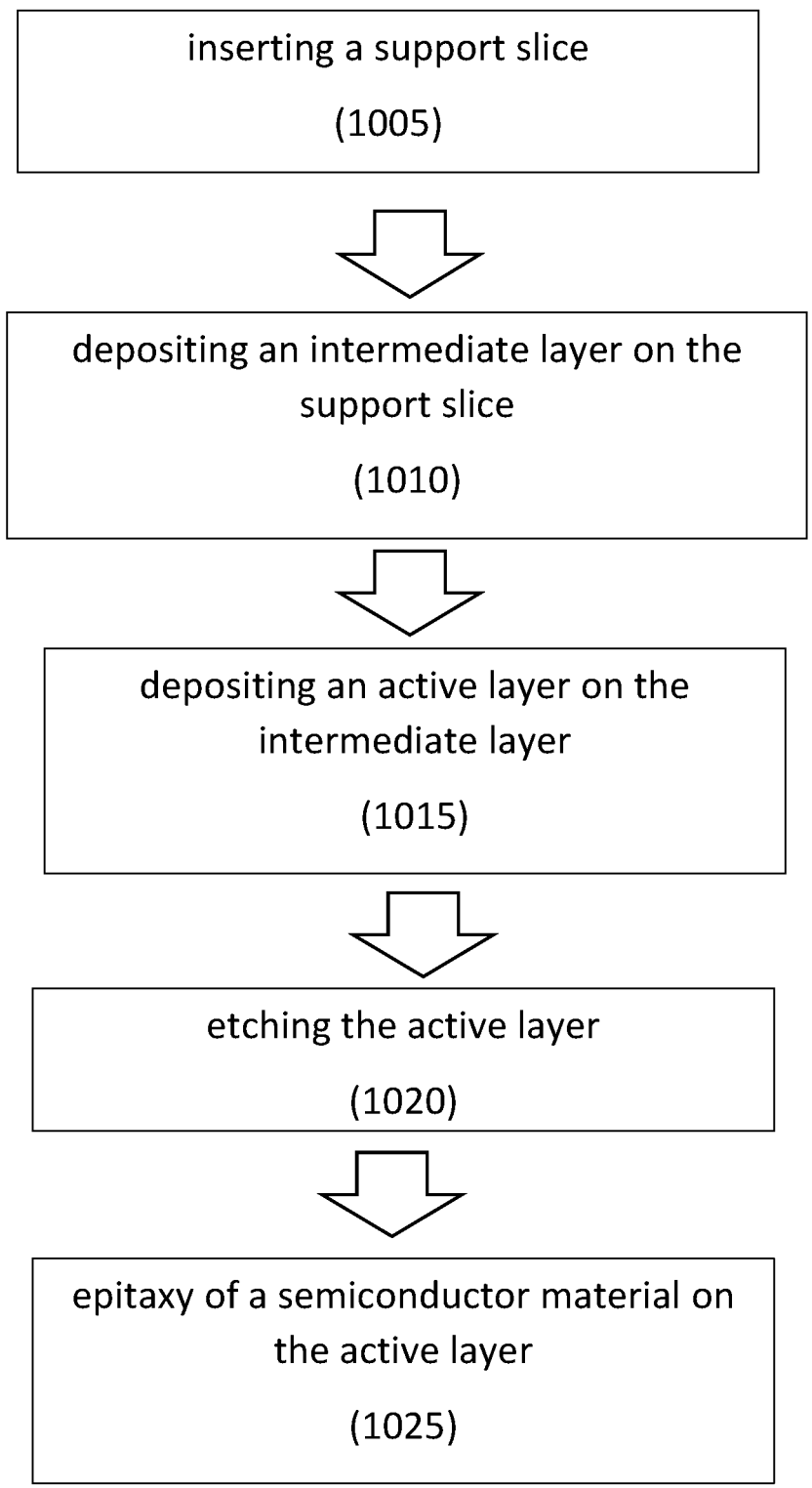

The invention will now be explained by means of various exemplary embodiments of the invention with the aid of the drawings, in which FIG. 1 shows as prior art a semiconductor substrate which consists of a support slice, an active layer and a buried oxide, wherein the oxide is arranged between the support slice and the active layer, FIG. 2 shows a semiconductor substrate which includes a support slice, an intermediate layer and an active layer, FIG. 3 shows a semiconductor substrate which is similar to the semiconductor substrate in FIG. 2, but which includes two further layers, wherein one of the further layers is arranged between the active layer and the intermediate layer and the other of the further layers is arranged between the intermediate layer and the support slice, FIG. 4 shows a semiconductor substrate which is similar to the semiconductor substrate in FIG. 3, but wherein the active layer includes a connecting semiconductor layer, FIG. 5 shows a semiconductor substrate which is similar to the semiconductor substrate in FIG. 3, but wherein the active layer has been etched, so that the active layer includes at least one gap or one trench, FIG. 6 shows a semiconductor substrate which is similar to the semiconductor substrate in FIG. 5, but wherein an epitaxial layer has been deposited on the etched active layer, FIG. 7 shows a flow diagram of a method for producing a semiconductor substrate.

FIG. 2 shows a first exemplary embodiment of a semiconductor substrate 20 for use in epitaxial methods of a semiconductor material 24 (represented dashed in FIG. 2), such as, for example, a group III-V semiconductor material. The semiconductor substrate 20 in FIG. 2 includes a support slice 21, an intermediate layer 23 which has been deposited on the support slice 21, and an active layer 22 which has been deposited on the intermediate layer 23. The intermediate layer 23 includes a material which has a reduced viscosity when the semiconductor substrate 20 is used in an epitaxial method. Owing to the reduced viscosity of the material in the intermediate layer 23, an adaptation or at least partial adaptation of the crystal lattice of the active layer 22 to a crystal lattice of the semiconductor material 24 at the transition 25 between the active layer 22 and the semiconductor material 24 can be enabled.

The viscosity of the material in the intermediate layer 23 is therefore (markedly) reduced at the epitaxial temperature of the semiconductor material compared with the viscosity of the material of the intermediate layer 23 at room temperature. Owing to the reduced viscosity of the material of the intermediate layer 23 at the epitaxial temperature of the semiconductor material 24, the intermediate layer 23 forms a flowing intermediate layer 23. Owing to the flowing intermediate layer 23, the adaptation of the crystal lattice of the active layer 22 to a crystal lattice of the semiconductor material 24 at the transition 25 between the active layer 22 and the semiconductor material 24 can be enabled. As a result, mechanical distortions or the density of the dislocations in the semiconductor material 24 can be reduced. A reduction of the mechanical distortions or the density of the dislocations can lead to an increase of the performance of components which are formed, for example, by the semiconductor material 24.

The active layer 22 can be formed by a semiconductor slice or a semiconductor wafer 22a. The semiconductor slice 22a can be deposited on the intermediate layer 23 by a waferbond process in order to form the active layer 22 of the semiconductor substrate 20. The semiconductor slice 22a or the active layer 22 should have a thickness as low as possible, e.g. ideally only a few atomic layers, in order to facilitate/enable the adaptation of the crystal lattice of the active layer 22 to the crystal lattice of the semiconductor layer 24 by the flowing intermediate layer 23 when the semiconductor substrate 20 is used in an epitaxial method. The thickness of the semiconductor slice 22a and thus the thickness of the active layer 22 can be reduced, for example, by grinding and/or polishing methods. In order to facilitate the deposition of the semiconductor slice 22a on the intermediate layer 23, thicknesses of the semiconductor slice 22a or the active layer 22 of less than 1 µm are provided. For example, the thickness of the semiconductor slice 22a or the active layer can comprise a range of approximately 30 nm to 100 nm. A thickness of the semiconductor slice or the active layer 22a of approximately 30 nm to 100 nm can be achieved, for example, by using a smart-cut method. Owing to the forming of the active layer 22 by the semiconductor slice 22a, the material of the active layer 22 can be selected according to the requirements of the epitaxial method. As a result, for example the active layer 22 can serve as a single-crystal support with crystalline properties or crystal lattice or lattice constant desired/suitable for the epitaxial method. For the epitaxy of gallium nitride, for example, the active layer can be formed by a silicon semiconductor slice, wherein the silicon semiconductor slice has a (111) crystal orientation. In other exemplary embodiments, the silicon semiconductor slice could have, for example, a (100) or (110) crystal orientation or instead of the silicon semiconductor slice a germanium semiconductor slice with a (111), (100) or (110) crystal orientation could be used to form the active layer.

In this exemplary embodiment, the material of the intermediate layer 23 includes an oxide, for example a doped oxide. In other exemplary embodiments, the oxide could be undoped. The oxide can be a silicate glass which is doped, for example, with boron and phosphorus in order to form a borophosphorosilicate glass (BPSG). The doping of the silicate glass with boron can comprise a range from 3% to 5%, with the phosphorus content being able to comprise a range from approximately 6% to 8%.

In other exemplary embodiments, the silicate glass can be doped with phosphorus or boron in order to form a phosphorosilicate glass (PSG) or a borosilicate glass. The doping of the silicate glass with phosphorus can comprise a range from approximately 6% to 8%. The doping of the silicate glass with boron can comprise a range from approximately up to 4%.

Owing to the doping of the silicate glass with boron and/or phosphorus, the glass transition temperature of the silicate glass can be reduced. If the glass transition temperature of the silicate glass is exceeded, e.g. during the epitaxy of the semiconductor material 24, the viscosity of the silicate glass is reduced. The silicate glass solid at room temperature is in this case therefore flowing or viscous. The silicate glass doped with boron and/or phosphorus has a glass transition temperature of approximately 700 to 950° C. For example, a doping of the silicate glass with approximately 8% phosphorus can result in a reduction of the glass transition temperature of the silicate glass from approximately 1200° C. to approximately 950° C. A doping of the silicate glass with approximately 8% phosphorus and 4% boron can result in a reduction of the glass transition temperature of the silicate glass from approximately 1200° C. to approximately 900° C. In a further example, the doping of the silicate glass with up to 5% phosphorus and up to 6% boron (percent by weight) can result in a reduction of the glass transition temperature of the silicate glass from approximately 1200° C. to approximately 700° C. The epitaxial temperature of gallium nitride comprises e.g. a range from approximately 1000° C. to 1150° C. and is therefore higher than the glass transition temperature of the doped silicate glass.

In this exemplary embodiment, the doping concentration of the silicate glass has substantially a constant course in a direction substantially perpendicular to the surface of the semiconductor substrate 20. In other exemplary embodiments, the doping concentration of the silicate glass can vary in a direction substantially perpendicular to the surface of the semiconductor substrate 20. For example, the doping concentration of the silicate glass could be lowest at the boundary regions between the intermediate layer 23 and the active layer 22 and between the intermediate layer 23 and the support slice 21. A maximum doping concentration could then be situated for example in the center of the intermediate layer 23.

FIG. 3 shows a further exemplary embodiment of a semiconductor substrate 30 which is similar to the exemplary embodiment in FIG. 2. The active layer 32 can again be formed by a semiconductor slice or a semiconductor wafer 32a. In FIG. 3 the semiconductor substrate 30 includes two further layers 36a, 36b which are arranged respectively above and below the intermediate layer 33 in this exemplary embodiment. The two further layers 36a, 36b include a further oxide or a thermal oxide. The two further layers 36a, 36b serve as diffusion barriers against the diffusion of atoms from the intermediate layer 33 into the active layer 32, the semiconductor layer 34 and/or the support slice 31. The further layers 36a, 36b can also serve as insulator layers or non-conductor layers. In this exemplary embodiment, the further layers 36a, 36b include silicon dioxide ($SiO_2$) which can be formed by thermal oxidation of silicon. In other exemplary embodiments, the further layers can include, for example, silicon nitride ($Si_3N_4$) which can be formed by a reaction of silicon with nitrogen.

The thicknesses of the intermediate layer 33 and of the respective further layers 36a, 36b may be different. For example, in FIG. 3 the further layers 36a, 36b each have a smaller thickness than the intermediate layer 33. Owing to the smaller thickness of the further layers 36a, 36b, the influence of the further layers 36a, 36b on the adaptation of the crystal lattice of the active layer 32 to the crystal lattice of the semiconductor layer 34 can be reduced. The thickness of the further layers 36a, 36b is therefore chosen such that they do not substantially influence the flowability of the intermediate layer. For example, the further layers 36a, 36b can each have a thickness of approximately 10 nm to 500 nm. The thickness of the intermediate layer 33 can lie, for example, in a range from approximately 10 nm to 5 µm. Although two further layers are shown in FIG. 3, it is understood that in other exemplary embodiments the semiconductor substrate could include, for example, no further layer or only one further layer. Furthermore, it is understood that also in other exemplary embodiments the thickness of the respective further layer can lie in a range from 10 nm to 500 nm and/or the thickness of the intermediate layer in a range from approximately 10 nm to 5 µm.

In the above exemplary embodiments, the active layer has been formed by an elemental semiconductor slice, such as, for example, a silicon or germanium semiconductor slice. FIG. 4 shows a further exemplary embodiment of a semiconductor substrate 40 which is similar to the exemplary embodiment in FIG. 3. In FIG. 4, the active layer 42 is formed by a connecting semiconductor wafer 42a. For example, the active layer can be formed by a gallium nitride (GaN), gallium arsenide (GaAs), silicon carbide (SiC) or gallium phosphide (GaP) semiconductor wafer 42a.

FIG. 5 shows a further exemplary embodiment of a semiconductor substrate 50 which is similar to the exemplary embodiments in FIG. 3 and FIG. 4. In the exemplary embodiments in FIG. 2, FIG. 3 and FIG. 4, the active layer 22, 32, 42 is formed by a continuous layer. In the exemplary embodiment in FIG. 5, the active layer 52, which has again been formed by a semiconductor slice or a semiconductor wafer, has been etched so that the active layer 52 includes at least one gap or one trench. Exemplary etching methods for forming the gap or the trench can include plasma etching or reactive ion etching ("Reactive Ion Etching" RIE)).

In FIG. 5, two gaps or trenches 57a, 57b in the active layer 52 are represented. In this exemplary embodiment, the active layer 52 is thus formed by three islands 52a, 52b, 52c. In other exemplary embodiments, for example less than three islands or more than three islands could be formed and/or the gaps or trenches could be additionally etched in the upper further layer 56a. The distance A between the respective islands 52a, 52b, 52c can be at least 10 µm. For example, the distance A between the respective islands 52a, 52b, 52c can comprise a range from approximately 10 to 50 µm.

The islands 52a, 52b, 52c shown in FIG. 5 can serve as substrate islands for a subsequent epitaxial method of a semiconductor material. Owing to the fact that the semiconductor material can be deposited on the substrate islands 52a, 52b, 52c, (further) mechanical stresses or distortions can be reduced.

For example, the thickness of the semiconductor material on the substrate islands could be a few micrometers, such as e.g. approximately 2 to 50 µm. The size or lateral extent of the islands 52a, 52b, 52c corresponds substantially to the size or lateral extent of the components which can be formed on the islands 52a, 52b, 52c. In other exemplary embodiments, the islands are formed such that the islands have a (somewhat) greater lateral extent than the components.

The islands 52a, 52b, 52c in the exemplary embodiment shown in FIG. 5 are arranged on the upper further layer 56a. The further layer 56a can serve as an insulator layer or non-conductor layer and thus electrically insulate the islands 52a, 52b, 52c or the components to be formed thereon from one another. In other exemplary embodiments, the semiconductor substrate could include only the lower further layer or no further layer, in which case the islands could then be arranged on the intermediate layer.

FIG. 6 shows a further exemplary embodiment of a semiconductor substrate 60 which is similar to the exemplary embodiment in FIG. 5. In FIG. 6, a semiconductor material 64 has been deposited on the islands 62a, 62b, 62c. The semiconductor material 64 has been deposited selectively on the islands 62a, 62b, 62c in the active layer 62, for example by an epitaxial method such as e.g. metal-organic vapor epitaxy (MOVPE), metal-organic chemical vapor deposition (MOCVD) or molecular beam epitaxy (MBE). The semiconductor material 64 can subsequently be further processed in order to form at least one component or a part thereof.

FIG. 7 shows a flow diagram of an exemplary method for producing a semiconductor substrate for use in epitaxial methods of a semiconductor material. The semiconductor substrate, which can be produced by the method shown in FIG. 7, can include one or more of the features of the semiconductor substrates shown in FIG. 2 to FIG. 6.

In a first step (1005) of the method, a support slice is inserted/provided. Subsequently in the step (1010) an intermediate layer is deposited on the support slice. For example, the intermediate layer can be deposited by a chemical vapor deposition process (or CVD) on the support slice. The intermediate layer is similar to or the same as the intermediate layer which has been described in the above exemplary embodiments, and can therefore comprise at least one feature of the intermediate layer described in the above exemplary embodiments. In step (1015) an active layer is deposited on the intermediate layer. The active layer can be formed by a semiconductor slice or a semiconductor wafer. The semiconductor slice can be deposited on the intermediate layer, for example, by a waferbond process. This process can include the grinding and/or polishing of the semiconductor slice in order to reduce the thickness of the semiconductor slice. The thickness of the active layer can be less than 1 µm. For example, the thickness of the active layer can comprise a range from approximately 30 nm to 100 nm.

In some exemplary embodiments, the method can include the step (1020) of etching the active layer, so that the active layer is provided with at least one gap or one trench. In these exemplary embodiments, the active layer is formed by at least two islands. Subsequently, a semiconductor material can be deposited on these islands e.g. by an epitaxial method.

Then, in step (1025) a semiconductor material can be deposited on the active layer by an epitaxial method such as, for example, metal-organic vapor epitaxy (MOVPE), metal-organic chemical vapor deposition (MOCVD) or molecular beam epitaxy (MBE). As described in the above exemplary embodiments, the intermediate layer includes a material which has the effect that the intermediate layer has a reduced viscosity at the epitaxial temperature of the semiconductor material and thereby forms a flowing intermediate layer.

Although FIG. 7 shows the step of etching, the present disclosure is to be understood such that in other exemplary embodiments this step is not present and the semiconductor material can be deposited on a continuous active layer.

In some exemplary embodiments, the method can include additionally the step of depositing a further layer before the deposition of the intermediate layer and/or after the deposition of the intermediate layer. The further layer can include a further oxide or a thermal oxide. For example, the further layer could be formed by silicon dioxide ($SiO_2$) which can be formed by thermal oxidation of silicon e.g. by a chemical vapor deposition method (CVD). In other exemplary embodiments, the further layer could include, for example, silicon nitride ($Si_3N_4$) which can be formed by a reaction of silicon with nitrogen.

The further layer can serve as a diffusion barrier against the diffusion of atoms from the intermediate layer into the semiconductor layer and/or into the support slice.

The support slice described in the above exemplary embodiments can be, for example, a silicon, sapphire, germanium or gallium arsenide support slice or substrate.

In some exemplary embodiments, the support slice includes a silicon support slice or a silicon substrate and the active layer is formed by a silicon semiconductor slice. In these exemplary embodiments, the semiconductor substrate corresponds to a silicon-on-insulator substrate (or SOI.

The semiconductor material described in the above exemplary embodiments can include, for example, a group III-V semiconductor material. For example, the semiconductor material could by gallium nitride, gallium arsenide, aluminum nitride, gallium phosphide or indium arsenide.

The semiconductor material described in the above exemplary embodiments can include, for example, a material or semiconductor material which is different from a material or semiconductor material of the active layer (hetero-epitaxy).

It is understood that in the above exemplary embodiments the term "active layer" can comprise the term "active substrate layer".

Although the invention has been described with reference to the above exemplary embodiments, it is understood that these exemplary embodiments serve to illustrate the invention and that the claims are not restricted to these exemplary embodiments. A person skilled in the art is capable of carrying out modifications and alternatives which can be considered as falling within the scope of protection of the appended claims. Each of the features disclosed or shown in the present application can be incorporated in the invention whether alone or in combination with another feature disclosed or shown in the application.

LIST OF REFERENCE SYMBOLS

10 semiconductor substrate according to the prior art
11 support slice of the semiconductor substrate 10
12 active layer of the semiconductor substrate 10
13 oxide layer of the semiconductor substrate 10
20 semiconductor substrate according to a first exemplary embodiment
21 support slice of the semiconductor substrate 20
22 active layer of the semiconductor substrate 20
22*a* semiconductor slice or semiconductor wafer for forming the active layer 22
23 intermediate layer of the semiconductor substrate 20
24 semiconductor material
25 transition between the active layer 22 of the semiconductor substrate 20 and the semiconductor material 24
30 semiconductor substrate according to a second exemplary embodiment
31 support slice of the semiconductor substrate 30
32 active layer of the semiconductor substrate 30
32*a* semiconductor slice or semiconductor wafer for forming the active layer 32
33 intermediate layer of the semiconductor substrate 30
34 semiconductor material
36*a* first further layer of the semiconductor substrate 30
36*b* second further layer of the semiconductor substrate 30
40 semiconductor substrate according to a third exemplary embodiment
41 support slice of the semiconductor substrate 40
42 active layer of the semiconductor substrate 40
42*a* connecting semiconductor slice for forming the active layer 42
43 intermediate layer of the semiconductor substrate 40
46*a* first further layer of the semiconductor substrate 40
46*b* second further layer of the semiconductor substrate 40
50 semiconductor substrate according to a fourth exemplary embodiment
51 support slice of the semiconductor substrate 50
52 active layer of the semiconductor substrate 50
52*a*, 52*b*, 52*c* islands in the active layer 52
A distance between the islands 52*a*, 52*b*, 52*c*
53 intermediate layer of the semiconductor substrate 50
56*a* first further layer of the semiconductor substrate 50
56*b* second further layer of the semiconductor substrate 50
57*a* first gap or trench in the active layer 52
57*b* second gap or trench in the active layer 52
60 semiconductor substrate according to a fifth exemplary embodiment
61 support slice of the semiconductor substrate 60
62 active layer of the semiconductor substrate 60
62*a*, 62*b*, 62*c* islands in the active layer 62
63 intermediate layer of the semiconductor substrate 60
64 semiconductor material
66*a* first further layer of the semiconductor substrate 60
66*b* second further layer of the semiconductor substrate 60
1005, 1010, 1015, 1020 and 1025 steps of a method for producing a semiconductor substrate according to at least one exemplary embodiment

The invention claimed is:

1. A method for producing a semiconductor substrate for use in epitaxial methods of a semiconductor material, the method comprising:
    inserting a support slice;
    depositing an intermediate layer on the support slice;

depositing an active layer on the intermediate layer; and
etching the active layer so that the active layer includes one or more islands surrounded by a gap or trench,
wherein the intermediate layer includes a material that has a reduced viscosity when the semiconductor substrate is used in an epitaxial method to deposit the semiconductor material on to the active layer in order to enable at least a partial adaptation of a crystal lattice of the active layer to a crystal lattice of the semiconductor material at the transition between the active layer and the semiconductor material.

2. The method according to claim 1, wherein the intermediate layer includes an oxide.

3. The method according to claim 2, wherein the material of the intermediate layer includes a doped oxide.

4. The method according to claim 2, wherein the intermediate layer includes a silicate glass.

5. The method according to claim 4, wherein the silicate glass is doped with boron and/or phosphorus in order to form borophosphorosilicate glass, phosphorosilicate glass and/or borosilicate glass.

6. The method according to claim 5, wherein the boron and/or phosphorus doping concentration has substantially a constant course in a direction substantially perpendicular to the surface of the semiconductor substrate.

7. The method according to claim 5, wherein the boron and/or phosphorus doping concentration varies in a direction substantially perpendicular to the surface of the semiconductor substrate.

8. The method according to claim 5, wherein the silicate glass is doped such that a glass transition temperature of the silicate glass is below an epitaxial temperature of the epitaxial method.

9. The method according to claim 5, wherein the material of the intermediate layer has a glass transition temperature of approximately 700 to 950° C.

10. The method according to claim 1, wherein the depositing of the active layer includes a depositing and/or bonding of a semiconductor slice or of a semiconductor wafer on the intermediate layer.

11. The method according to claim 10, further comprising selecting a semiconductor slice or a semiconductor wafer according to the requirements of a subsequent epitaxial method.

12. The method according to claim 1, wherein the active layer has a thickness of less than 1 μm.

13. The method according to claim 1, further comprising depositing at least one further layer on the support slice and/or the intermediate layer.

14. The method according to claim 13, wherein the at least one further layer includes a further oxide.

15. The method according to claim 13, wherein the at least one further layer serves as diffusion barrier against the diffusion of atoms from the intermediate layer and/or the support slice.

16. The method according to claim 1, further comprising the epitaxy of the semiconductor material on the active layer.

17. The method according to claim 16, wherein the viscosity of the material of the intermediate layer at the epitaxial temperature of the semiconductor material is reduced compared with the viscosity of the material of the intermediate layer at room temperature.

18. The method according to claim 16, wherein the material of the intermediate layer has the effect that the intermediate layer at the epitaxial temperature of the semiconductor material forms a flowing intermediate layer.

19. A method for producing a semiconductor substrate for use in epitaxial methods of a semiconductor material, the method comprising:
inserting a support slice;
depositing an intermediate layer on the support slice;
depositing an active layer on the intermediate layer;
etching the active layer so that the active layer includes one or more islands surrounded by a gap or trench; and
epitaxy of a semiconductor material on the active layer, wherein the intermediate layer includes a material that has the effect that the intermediate layer at the epitaxial temperature of the semiconductor material forms a flowing intermediate layer.

20. The method according to claim 19, wherein the flowing intermediate layer enables an adaptation of a crystal lattice of the active layer to a crystal lattice of the semiconductor material at the transition between the active layer and the semiconductor material.

21. The method according to claim 16, wherein the semiconductor material includes a group III-V semiconductor material.

22. The method according to claim 16, wherein the semiconductor material and the active layer include different material.

23. The method according to claim 16, wherein the semiconductor substrate includes a silicon substrate or silicon-on-insulator substrate (SOI substrate).

* * * * *